United States Patent
Yang et al.

(10) Patent No.: US 9,621,155 B2
(45) Date of Patent: Apr. 11, 2017

(54) SWITCHING CIRCUIT AND CURRENT COMPENSATING METHOD THEREIN

(71) Applicant: DELTA ELECTRONICS, INC., Taoyuan (TW)

(72) Inventors: Chang-Jing Yang, Taoyuan (TW); Li-Fan Lin, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 14/988,703

(22) Filed: Jan. 5, 2016

(65) Prior Publication Data

US 2016/0308528 A1    Oct. 20, 2016

(30) Foreign Application Priority Data

Apr. 17, 2015 (TW) .............................. 104112321 A (51) Int. Cl.
*H03K 17/687* (2006.01)
*H03K 17/16* (2006.01)

(52) U.S. Cl.
CPC ....... *H03K 17/6871* (2013.01); *H03K 17/162* (2013.01)

(58) Field of Classification Search
CPC ... H03K 17/687; H03K 17/693; H03K 17/063
USPC ....... 327/430, 427, 434–437, 419, 424, 379, 327/380–386, 108–112, 543; 326/82, 83, 326/87
See application file for complete search history.

(56) References Cited

U.S. PATENT DOCUMENTS

| | | | | |
|---|---|---|---|---|
| 2008/0265980 | A1* | 10/2008 | Reichl | H01L 29/8083 327/431 |
| 2011/0102054 | A1* | 5/2011 | Domes | H01L 24/49 327/419 |
| 2012/0105131 | A1* | 5/2012 | Biela | H03K 17/687 327/430 |

FOREIGN PATENT DOCUMENTS

| | | |
|---|---|---|
| TW | 200618472 A | 6/2006 |
| TW | 200820166 A1 | 5/2008 |
| TW | 201036173 A1 | 10/2010 |
| TW | 201145822 A1 | 12/2011 |

* cited by examiner

*Primary Examiner* — Lincoln Donovan
*Assistant Examiner* — Thomas Skibinski
(74) *Attorney, Agent, or Firm* — CKC & Partners Co., Ltd.

(57) ABSTRACT

A switching circuit includes a normally-on switch, a normally-off switch, a current compensating unit and a current sharing unit. Each of the normally-on switch and the normally-off switch include a first terminal, a second terminal and a control terminal respectively. The first terminal of the normally-off switch is connected to the second terminal of the normally-on switch. The second terminal of the normally-off switch is connected to the control terminal of the normally-on switch. The current compensating unit is connected to the normally-on switch and configured to generate a compensating current when a leakage current of the normally-on switch is smaller than the leakage current of the normally-off switch. The current sharing unit is connected to the normally-off switch and configured to share the leakage current of the normally-on switch when the leakage current of the normally-on switch is larger than the leakage current of the normally-off switch.

14 Claims, 5 Drawing Sheets

SWITCHING CIRCUIT AND CURRENT COMPENSATING METHOD THEREIN

RELATED APPLICATIONS

This application claims priority to Taiwan Application Serial Number 104112321, filed Apr. 17, 2015, which is herein incorporated by reference.

BACKGROUND

Technical Field

The present disclosure relates to a switching circuit, and in particular, to a power switching circuit.

Description of Related Art

In a cascode switching circuit, due to the different characteristics of semiconductor material used in an upper switch and a lower switch, a mismatch of the leakage current of the upper switch and of the lower switch often occurs. Especially in different operating temperatures, such as a high temperature and a low temperature, the mismatch of the leakage current of the upper switch and of the lower switch are also different, which may result in the shifting of the bias voltage of the switch.

When the mismatch of the leakage current becomes substantial, the shifted bias voltage may cause the failure of the switch or the reduction of the performance of the switch in an abnormal operating condition, and lower the reliability of the switching circuit. Therefore, improving the leakage current matching issue between the upper switch and the lower switch in the cascode switching circuit is an important area of research in the field.

SUMMARY

One aspect of the present disclosure is a switching circuit. The switching circuit includes a normally-on switching unit, a normally-off switching unit, a current compensating unit and a current sharing unit. The normally-on switching unit includes a first terminal, a second terminal and a control terminal. The normally-off switch includes a first terminal, a second terminal and a control terminal. The first terminal of the normally-off switching unit is electrically connected to the second terminal of the normally-on switching unit. The second terminal of the normally-off switching unit is electrically connected to the control terminal of the normally-on switching unit. The current compensating unit is electrically connected to the normally-on switching unit and configured to generate a compensating current when a leakage current of the normally-on switching unit is smaller than the leakage current of the normally-off switching unit. The current sharing unit is electrically connected to the normally-off switching unit and configured to share the leakage current of the normally-on switching unit when the leakage current of the normally-on switching unit is larger than the leakage current of the normally-off switching unit.

Another aspect of the present invention is a switching circuit. The switching circuit includes a junction field-effect transistor, a first metal-oxide-semiconductor field-effect transistor, a first resistor and a current sharing element. The junction field-effect transistor includes a first drain terminal, a first source terminal and a first gate terminal. The first metal-oxide-semiconductor field-effect transistor (MOSFET), includes a second drain terminal, a second source terminal and a second gate terminal. The second drain terminal is electrically connected to the first source terminal. The second source terminal is electrically connected to the first gate terminal. The first resistor is electrically connected between the first drain terminal and the first source terminal. The current sharing element is electrically connected between the second drain terminal and the second source terminal.

One another aspect of the present disclosure is a current compensating method of a switching circuit, which can be applied to the switching circuit in the aforementioned embodiments. The current compensating method includes: generating a compensating current flow to the normally-off switching unit by the current compensating unit when the leakage current of the normally-on switching unit is smaller than the leakage current of the normally-off switching unit; and sharing the leakage current of the normally-on switching unit by the current sharing unit when the leakage current of the normally-on switching unit is larger than the leakage current of the normally-off switching unit.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

The terms "about" and "approximately" in the disclosure are used as equivalents. Any numerals used in this disclosure with or without "about," "approximately," etc. are meant to cover any normal fluctuations appreciated by one of ordinary skill in the relevant art. In certain embodiments, the term "approximately" or "about" refers to a range of values that fall within 20%, 10%, 5%, or less in either direction (greater or less than) of the stated reference value unless otherwise stated or otherwise evident from the context.

In the following description and in the claims, the terms "include" and "comprise" are used in an open-ended fashion, and thus should be interpreted to mean "include, but not limited to." As used herein, the term "and/or" includes any and all combinations of one or more of the associated listed items.

In this document, the term "coupled" may also be termed "electrically coupled," and the term "connected" may be termed "electrically connected." "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

Figure 1:
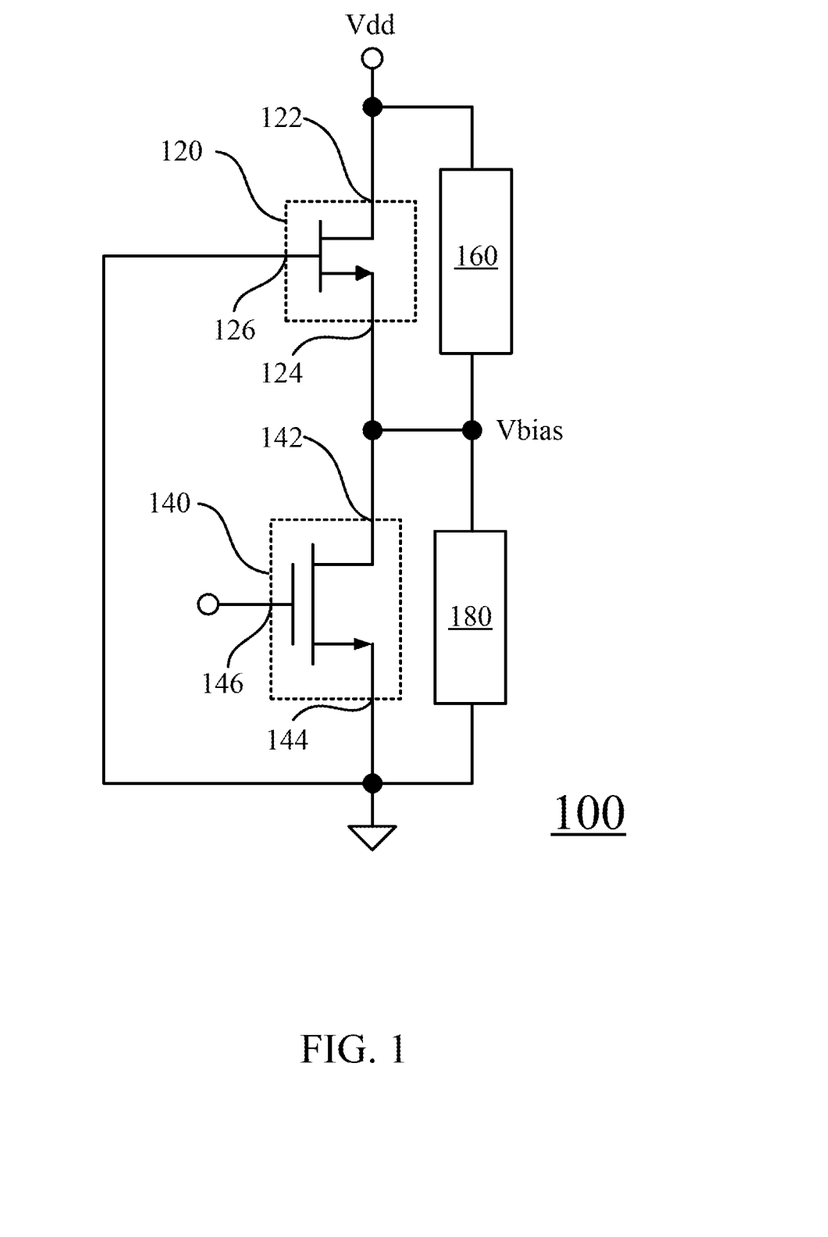
FIG. 1 is a diagram illustrating a switching circuit according to an embodiment of the present disclosure.

One aspect of the present disclosure is a switching circuit. Reference is made to FIG. 1. FIG. 1 is a diagram illustrating a switching circuit 100 according to an embodiment of the present disclosure. In the present embodiment, the switching circuit 100 includes a normally-on switching unit 120, a normally-off switching unit 140, a current compensating unit 160 and a current sharing unit 180. The normally-on switching unit 120 includes a first terminal 122, a second terminal 124 and a control terminal 126. The normally-off switch 140 includes a first terminal 142, a second terminal 144 and a control terminal 146. The first terminal 142 of the normally-off switching unit 140 is electrically connected to the second terminal 124 of the normally-on switching unit 120, and the second terminal 144 of the normally-off switching unit 140 is electrically connected to the control terminal 126 of the normally-on switching unit 120 such that a cascode structure is formed. In some embodiment, the first terminal 122 of the normally-on switching unit 120 is configured to receive an operating voltage Vdd (e.g., 500 volts). In addition, the current compensating unit 160 is electrically connected between the first terminal 122 and the second terminal 124 of the normally-on switching unit 120. The current compensating unit 160 may be configured to generate and provide a compensating current flow to the normally-off switching unit 140 when the leakage current of the normally-on switching unit 120 is smaller than the leakage current of the normally-off switching unit 140. The current sharing unit 180 is electrically connected between the first terminal 142 and the second terminal 144 of the normally-off switching unit 140. The current sharing unit 180 may be configured to share the leakage current of the normally-on switching unit 120 when the leakage current of the normally-on switching unit 120 is larger than the leakage current of the normally-off switching unit 140. The specific operation of the current compensating unit 160 and the current sharing unit 180 will be explained in the following paragraphs.

Specifically, in some embodiments of the present disclosure, the normally-on switching unit 120 may be a junction field-effect transistor (JFET). The first terminal 122, the second terminal 124 and the control terminal 126 of the normally-on switching unit 120 may be the drain terminal, the source terminal and the gate terminal of the JFET respectively. In some embodiments of the present disclosure, the normally-off switching unit 140 may be a metal-oxide-semiconductor field-effect transistor (MOSFET). The first terminal 142, the second terminal 144 and the control terminal 146 of the normally-off switching unit 120 may be the drain terminal, the source terminal and the gate terminal of the MOSFET respectively, but the present disclosure is not limited thereto. In other embodiments, other types of transistor switches may be used to form the switching circuit 100 with cascode structure such that the upper switch (e.g., the normally-on switching unit 120) and the lower switch (e.g., the normally-off switching unit 140) of the switching circuit 100 are in a normally-on state and a normally-off state respectively without departing from the scope or spirit of the disclosure.

In some embodiments, the JEFT may be a III-V compound semiconductor element formed by III-V compound semiconductor material such as GaAs or InGaAs, and the MOSFET may be a silicon based semiconductor element formed by silicon based semiconductor material, but the present disclosure is not limited thereto. Other transistor switching elements known by one skilled in the art may implement the switching circuit 100 disclosed in the present disclosure.

In the present power switching element adopting cascode structure, due to the different characteristic of the corresponding semiconductor element between the upper switch (e.g., the normally-on switching unit 120) and the lower switch (e.g., the normally-off switching unit 140), the leakage current mismatch between the upper and lower switch becomes a serious issue when operated in different operating temperatures. For example, for the power switching element with the upper switch (e.g., the normally-on switching unit 120) made by III-V compound semiconductor material and the lower switch (e.g., the normally-off switching unit 140) made by silicon based semiconductor material, the variation of the operating temperature will affect the variation of the leakage current of the upper switch and the lower switch at different levels.

In one embodiment of the present disclosure, when the switching circuit 100 is operated at a normal and low operating temperature (e.g., room temperature between 25 degrees Celsius and 100 degrees Celsius), the leakage current of the normally-off switching unit 140 is about 1 nanoampere (nA), which is lower than the leakage current of the normally-on switching unit 120. On the other hand, when the switching circuit 100 is operated at a high operating temperature (e.g., temperature between 100 degrees Celsius and 175 degrees Celsius), the leakage current of the normally-off switching unit 140 is about 5 microampere (uA), which is higher than the leakage current of the normally-on switching unit 120 at the same operating temperature. Alternatively stated, the leakage current of the normally-off switching unit 140 is different from the leakage current of the normally-on switching unit 120 no matter in the low operating temperature or the high operating temperature, which causes the switch current mismatch issues.

If the leakage current mismatch between the upper and lower switch is not compensated, the switching circuit 100 may not perform the normal function. When the leakage current of the normally-off switching unit 140 is smaller than the leakage current of the normally-on switching unit 120, the bias voltage of the first terminal 142 of the normally-off switching unit 140 (i.e., the bias voltage of the second terminal 124 of the normally-on switching unit 120) will increase correspondingly. When the voltage difference between the first terminal 142 and the second terminal 144 of the normally-off switching unit 140 is larger than the breakdown voltage of the normally-off switching unit 140 with the situation of the leakage current mismatch getting worse, the normally-off switching unit 140 breakdowns such that the cascode switch fails to perform the normal function.

On the other hand, when the leakage current of the normally-off switching unit 140 is larger than the leakage current of the normally-on switching unit 120, in order to increase the leakage current of the normally-on switching unit 120 to match the leakage current of the normally-off switching unit 140, the gate-to-source voltage of the normally-on switching unit 120 increases and the bias voltage of the second terminal 124 of the normally-on switching unit 120 (i.e. the bias voltage of the first terminal 142 of the normally-off switching unit 140) will decrease correspondingly. When the bias voltage reaches the threshold voltage of the normally-on switching unit 120 with the situation of the leakage current mismatch degrading, the normally-on switching unit 120 is configured to operate in a semi-ON operating region. The cascode switch fails to perform normal functions due to the performance reduction of the normally-on switching unit 120 if the switching circuit 100 often operates in this mode.

In order to solve the issue that the aforementioned switch bias cannot operate in a proper region and the performance of the switch is affected, the current compensating unit 160 and the current sharing unit 180 is provided in the present disclosure to correspondingly compensate the mismatch leakage current of the upper and the lower switch in different operating temperature. The current compensating unit 160 is configured to generate the compensating current flow to the normally-off switching unit 140 when the leakage current of the normally-on switching unit 120 is smaller than the leakage current of the normally-off switching unit 140. On the other hand, the current sharing unit 180 is configured to share the leakage current of the normally-on switching unit 120 when the leakage current of the normally-on switching unit 120 is larger than the leakage current of the normally-off switching unit 140.

Figure 2A:
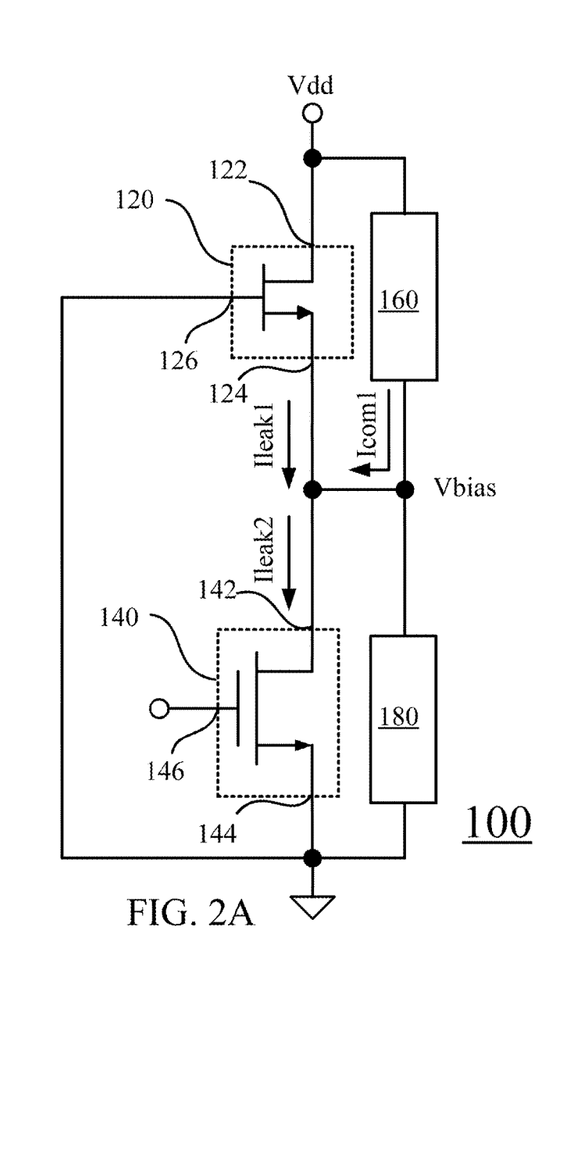
FIG. 2A is a diagram illustrating a switching circuit according to an embodiment of the present disclosure.
Figure 2B:
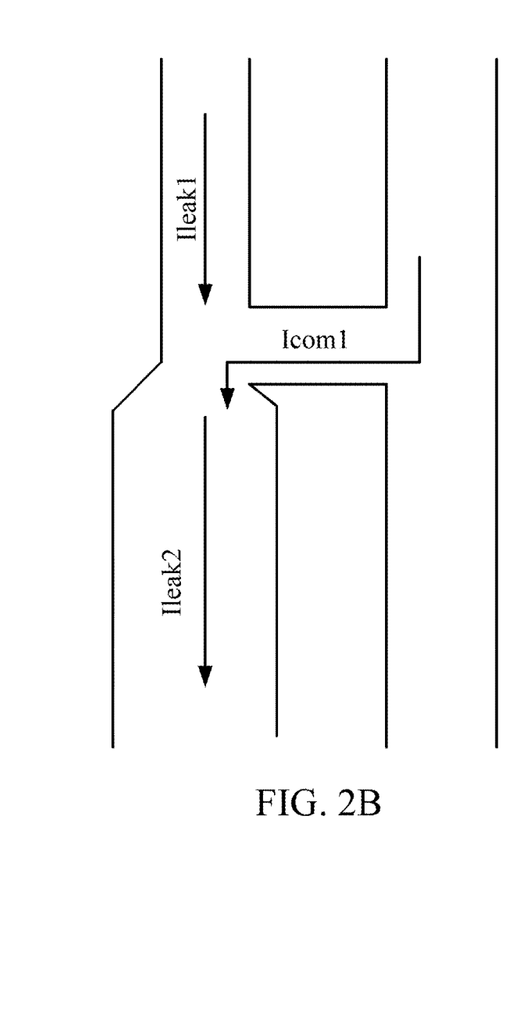
FIG. 2B is a diagram illustrating current path according to an embodiment of the present disclosure.

Reference is made to FIG. 2A and FIG. 2B. FIG. 2A is a diagram illustrating the switching circuit 100 according to an embodiment of the present disclosure. FIG. 2B is a diagram illustrating the current path according to an embodiment of the present disclosure. In the embodiment shown in FIG. 2A and FIG. 2B, the switching circuit 100 is operated at the high operating temperature (e.g., temperature between 100 degrees Celsius and 175 degrees Celsius), such that the leakage current Ileak1 of the normally-on switching unit 120 is smaller than the leakage current Ileak2 of the normally-off switching unit 140.

In the present embodiment, the switching circuit 100 is operated at the aforementioned high operating temperature and the leakage current Ileak1 of the normally-on switching unit 120 is smaller than the leakage current Ileak2 of the normally-off switching unit 140. In order to prevent the mismatch of the leakage current Ileak1 of the normally-on switching unit 120 and the leakage current Ileak2 of the normally-off switching unit 140, the current compensating unit 160 may be configured to provide the compensating current Icom1 flowing to the normally-off switching unit 140. As shown in FIG. 2B, the compensating current Icom1 provides additional current compensation to match the leakage current Ileak2 needed by the normally-off switching unit 140, and thus the normally-on switching unit 120 do not need to increase the leakage current Ileak1 to match the leakage current Ileak2 of the normally-off switching unit 140. Therefore, the bias voltage Vbias of the second terminal 124 of the normally-on switching unit 120 does not have to be increased and shifted from the original proper operating region for increasing the leakage current Ileak1.

Therefore, when operated at the high operating temperature, the normally-on switching unit 120 is not configured to operate in a semi-ON operating region with the shifting of the bias voltage Vbias of the second terminal 124 of the normally-on switching unit 120 (i.e., the bias voltage of the first terminal 142 of the normally-off switching unit 140). Alternatively stated, the current compensating unit 160 may prevent the performance reduction of the normally-on switching unit 120 due to the shifting of the bias voltage Vbias.

Figure 3A:
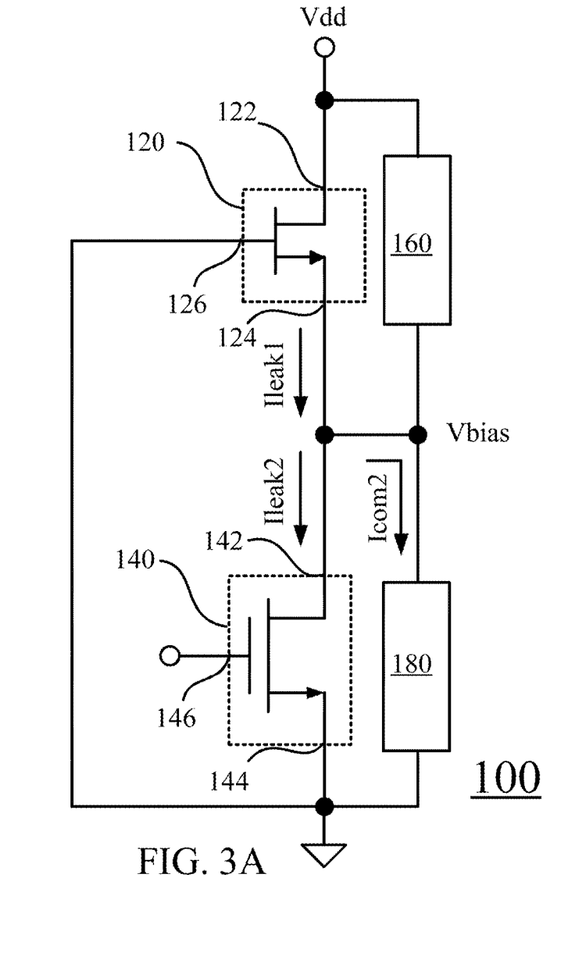
FIG. 3A is a diagram illustrating a switching circuit according to an embodiment of the present disclosure.
Figure 3B:
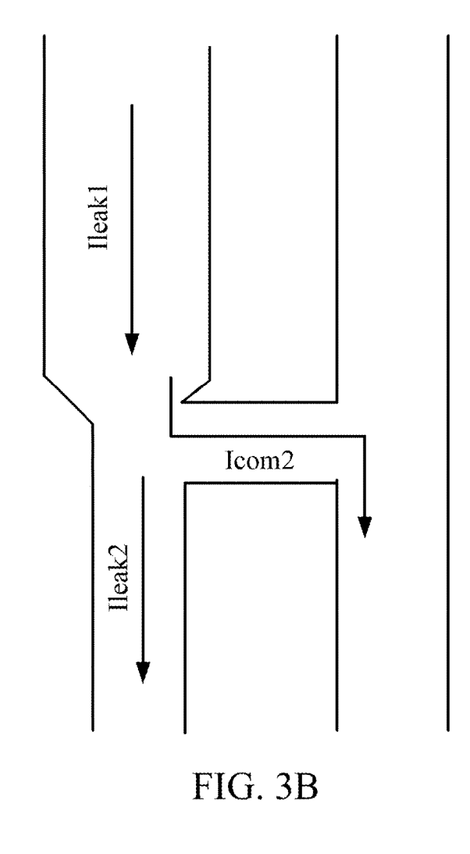
FIG. 3B is a diagram illustrating current path according to an embodiment of the present disclosure.

Reference is made to FIG. 3A and FIG. 3B. FIG. 3A is a diagram illustrating the switching circuit 100 according to an embodiment of the present disclosure. FIG. 3B is a diagram illustrating the current path according to an embodiment of the present disclosure. In the embodiment shown in FIG. 3A and FIG. 3B, the switching circuit 100 is operated at the normal room temperature (e.g., temperature between 25 degrees Celsius and 100 degrees Celsius), such that the leakage current Ileak1 of the normally-on switching unit 120 is larger than the leakage current Ileak2 of the normally-off switching unit 140.

In the present embodiment, the switching circuit 100 is operated at the aforementioned room temperature and the leakage current Ileak1 of the normally-on switching unit 120 is larger than the leakage current Ileak2 of the normally-off switching unit 140. In order to prevent the mismatch of the leakage current Ileak1 of the normally-on switching unit 120 and the leakage current Ileak2 of the normally-off switching unit 140, the current sharing unit 180 may be configured to provide an additional current path to share the leakage current Ileak1 of the normally-on switching unit 120. As shown in FIG. 3B, since the leakage current Ileak1 of the normally-on switching unit 120 is divided to the leakage current Ileak2 of the normally-off switching unit 140 and the compensating current Icom2 flowing to the current sharing unit 180, and thus the normally-off switching unit 140 do not need to increase the leakage current Ileak2 to match the leakage current Ileak1 of the normally-on switching unit 120. Therefore, the bias voltage Vbias of the first terminal 142 of the normally-off switching unit 140 (i.e., the bias voltage of the second terminal 124 of the normally-on switching unit 120) does not have to be shifted from the original proper operating region.

Therefore, the voltage difference between the first terminal and the second terminal of the normally-off switching unit 140 is not configured to be larger than the breakdown voltage of the normally-off switching unit 140 with the shifting of the bias voltage of the first terminal 142 of the normally-off switching unit 140 (i.e. the bias voltage Vbias of the second terminal 124 of the normally-on switching unit 120). Alternatively stated, the current sharing unit 180 may prevent the breakdown of the normally-off switching unit 140 due to the shifting of the bias voltage Vbias.

In the aforementioned embodiment, in order to control the switching circuit 100 to perform the normal function, the operating region of the bias voltage Vbias is between the breakdown voltage of the normally-off switching unit 140 and a threshold voltage value, in which the threshold voltage value causes the normally-on switching unit 120 operated in the semi-on state.

When the gate voltage of the JFET is smaller than a negative threshold value, the depletion region expands such that the channel disappears, or is pinched off, and the JEFT has a relatively large equivalent resistance. In this state, the gate voltage of the JFET is at a negative value called a pinch-off voltage. In an embodiment that the normally-on switching unit 120 is a JFET, the gate voltage of the JFET is the negative value of the bias voltage Vbias of the second terminal 124 of the normally-on switching unit 120 (i.e., the source terminal of the JFET). Therefore in the present embodiment, the aforementioned threshold voltage value which causes the normally-on switching unit 120 operated in the semi-on state is defined as the voltage value larger than the absolute value of the pinch-off voltage. For example, if the pinch-off voltage of the JFET in the present embodiment is about −15 volts, the threshold voltage of the normally-on switching unit 120 may be configured to be about 15 volts, such that the operating voltage of the normally-on switching unit 120 is larger than 15 volts and smaller than the breakdown voltage of the normally-off switching unit 140.

In addition, in an embodiment that the normally-off switching unit 140 is a MOSFET, the breakdown voltage of the normally-off switching unit 140 is the maximum withstand voltage between the drain terminal and the source terminal of the MOSFET. For example, in one embodiment the breakdown voltage of the normally-off switching unit 140 (i.e., MOSFET) is about 25 volts.

Thus, in the aforementioned embodiment, in order to control the switching circuit 100 to perform the normal function, the operating region of the bias voltage Vbias of the second terminal 124 of the normally-on switching unit 120 is configured between about 15 volts and about 25 volts. When the switching circuit 100 is operated in the operating region, the aforementioned issues such as the performance reduction of the upper switch or the breakdown of the lower switch may be prevented. It is noted that the operating region of the bias voltage Vbias may be configured according to actual needs, the values stated above are only by examples and not meant to limit the present disclosure.

Figure 4:
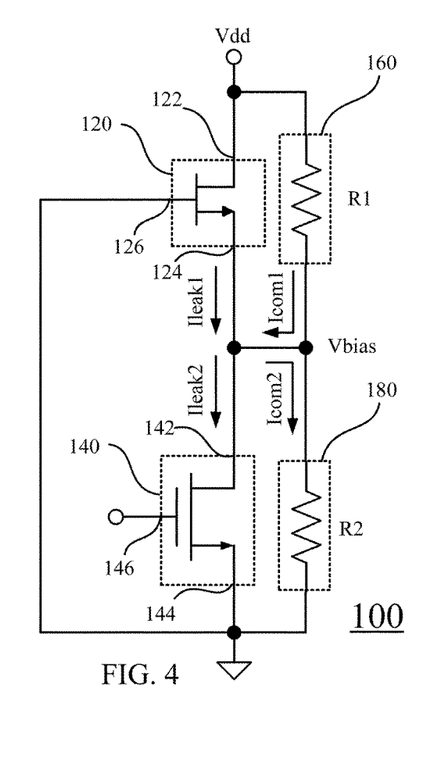
FIG. 4 is a diagram illustrating a switching circuit according to an embodiment of the present disclosure.

Reference is made to FIG. 4. FIG. 4 is a diagram illustrating the switching circuit 100 according to an embodiment of the present disclosure. In order to operate the bias voltage Vbias of the second terminal 124 of the normally-on switching unit 120 in the operating region stated above, in one embodiment the normally-on switching unit 120 may includes a resistor R1, and the normally-off switching unit 140 may includes a resistor R2. The resistor R1 is electrically connected between the first terminal 122 and the second terminal 124 of the normally-on switching unit 120, and the resistor R2 is electrically connected between the first terminal 142 and the second terminal 144 of the normally-off switching unit 140.

When the leakage current Ileak1 of the normally-on switching unit 120 is smaller than the leakage current Ileak2 of the normally-off switching unit 140, the compensating current Icom1 will be generated according to the operating voltage Vdd (e.g., 500 volts) of the switching circuit 100, and flow from the resistor R1 to the normally-off switching unit 140. When the leakage current Ileak1 of the normally-on switching unit 120 is larger than the leakage current Ileak2 of the normally-off switching unit 140, a current path is provided via the resistor R2 to share the leakage current Ileak1 of the normally-on switching unit 120 such that the compensating current Icom2 flow into the resistor R2.

Specifically, the corresponding leakage current Ileak1 and Ileak2 of the normally-on switching unit 120 and the normally-off switching unit 140 and the compensating current Icom1 and Icom2 flow through the resistor R1 and the resistor R2 respectively are determined by the bias voltage Vbias of the second terminal 124 of the normally-on switching unit 120 and the operating voltage Vdd of the switching circuit 100. Therefore, in order to compensate the mismatch of the corresponding leakage current Ileak1 and Ileak2 of the normally-on switching unit 120 and the normally-off switching unit 140 by the compensating current Icom1 of the resistor R1 and the compensating current Icom2 of the resistor R2, and control the bias voltage Vbias between the threshold voltage value of the normally-on switching unit 120 and the breakdown voltage of the normally-off switching unit 140, the equivalent resistance value of the resistor R1 and R2 may be determined by the operating voltage Vdd of the switching circuit 100, the threshold voltage value of the normally-on switching unit 120 and the breakdown voltage of the normally-off switching unit 140.

In one embodiment of the present disclosure, the equivalent resistance value of the resistor R1 is configured between 10 megohm and 100 megohm, and the equivalent resistance value of the resistor R2 is configured between 0.1 megohm and 20 megohm.

By configuring appropriate equivalent resistance value of the resistor R1 and the resistor R2 according to the operating voltage Vdd of the switching circuit 100, the threshold voltage value causing the normally-on switching unit 120 to be semi-on, and the breakdown voltage of the normally-off switching unit 140, the leakage current Ileak1 and Ileak2 may be compensated appropriately and the failure of the switching circuit 100 is prevented.

In addition, in some embodiments, the resistor R1 and the resistor R2 may be variable resistors. The equivalent resistance value of the resistor R1 and the resistor R2 may be dynamically adjusted according to the variation of the operating voltage Vdd of the switching circuit 100 respectively, such that when the switching circuit 100 is operated in different level of the operating voltage Vdd, the bias voltage Vbias of the second terminal 124 of the normally-on switching unit 120 is configured at an ideal operating region.

Figure 5:
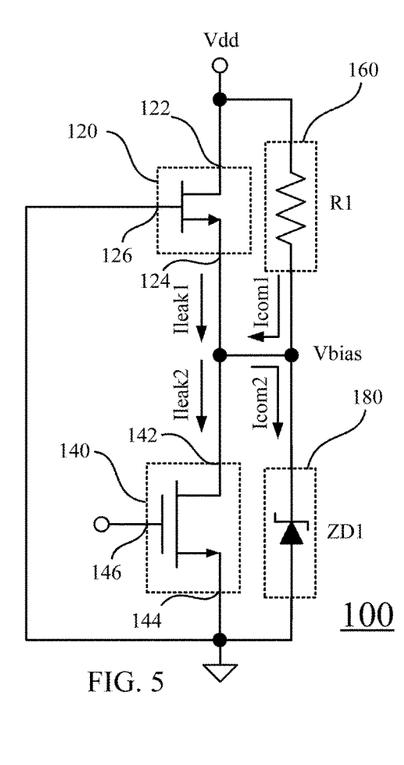
FIG. 5 is a diagram illustrating a switching circuit according to an embodiment of the present disclosure.

Reference is made to FIG. 5. FIG. 5 is a diagram illustrating the switching circuit 100 according to another embodiment of the present disclosure. In the present embodiment, the normally-on switching unit 120 also includes the resistor R1, and the normally-off switching unit 140 may includes a zener diode ZD1. The resistor R1 is electrically connected between the first terminal 122 and the second terminal 124 of the normally-on switching unit 120, and the zener diode ZD1 is electrically connected between the first terminal 142 and the second terminal 144 of the normally-off switching unit 140.

Similar to the embodiment disclosed in the above paragraphs, when the leakage current Ileak1 of the normally-on switching unit 120 is smaller than the leakage current Ileak2 of the normally-off switching unit 140, the compensating current Icom1 will be generated according to the operating voltage Vdd (e.g., 500 volts) of the switching circuit 100, and flow from the resistor R1 to the normally-off switching unit 140.

On the other hand, when the leakage current Ileak1 of the normally-on switching unit 120 is larger than the leakage current Ileak2 of the normally-off switching unit 140, a current path is provided via the zener diode ZD1 to share the leakage current Ileak1 of the normally-on switching unit 120 such that the compensating current Icom2 flow into zener diode ZD1. Thus, the leakage current Ileak2 of the normally-off switching unit 140 do not need to be increased to match the leakage current Ileak1 of the normally-on switching unit 120.

In the present embodiment, the zener voltage of the zener diode ZD1 may be configured according to the breakdown voltage of the normally-off switching unit 140. Specifically, the zener voltage of the zener diode ZD1 may be configured to be smaller or equal to the breakdown voltage of the normally-off switching unit 140. When the bias voltage Vbias of the second terminal 124 of the normally-on switching unit 120 is larger than the zener voltage of the zener diode ZD1, the compensating current Icom2 may flow through the current path via the zener diode ZD1 to share the current and maintain the voltage difference between the first terminal 142 and the second terminal 144 of the normally-off switching unit 140, such that the voltage difference between two terminals of the normally-off switching unit 140 is not larger than the breakdown voltage of the normally-off switching unit 140 and results in the failure of the switching circuit 100 due to the breakdown of the normally-off switching unit 140. For example, the zener voltage value of the zener diode ZD1 may be configured to about 25 volts.

Therefore, similar to the embodiments disclosed in the above paragraphs, the resistance value of the resistor R1 and the zener voltage value of the zener diode ZD1 may be determined according to the operating voltage Vdd of the switching circuit 100, the threshold voltage of the normally-on switching unit 120 and the breakdown voltage of the normally-off switching unit 140.

According to the aforementioned embodiments, by locating appropriate current compensating unit 160 and the current sharing unit 180, the switching circuit 100 disclosed in the present disclosure may lessen the switching failure or performance reduction issues resulted from the leakage current mismatch between the upper switch and the lower switch of the cascode structure. The switching circuit 100 may be applied in power electronic devices (e.g., converters) as power switching devices. The specific operation and function of the power switching devices applying the switching circuit 100 is disclosed in above paragraphs and omitted here for the sake of brevity.

Figure 6:
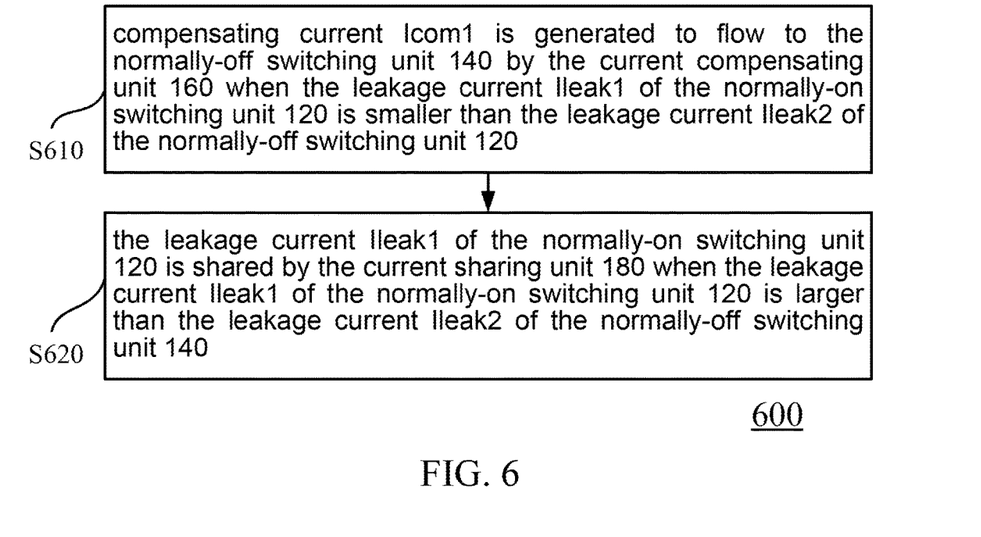
FIG. 6 is a flowchart illustrating a current compensating method according to an embodiment of the present disclosure.

Reference is made to FIG. 6. FIG. 6 is a flowchart illustrating a current compensating method 600 according to an embodiment of the present disclosure. For better understanding of the present disclosure, the following method is discussed in relation to the switching circuit 100 of the embodiments shown in FIG. 1-5, but is not limited thereto. In an embodiment, the current compensating method 600 includes step S610 and step S620. First, in the step S610, compensating current Icom1 is generated to flow to the normally-off switching unit 140 by the current compensating unit 160 when the leakage current Ileak1 of the normally-on switching unit 120 is smaller than the leakage current Ileak2 of the normally-off switching unit 120 (as shown in FIGS. 2A and 2B).

Next, the leakage current Ileak1 of the normally-on switching unit 120 is shared by the current sharing unit 180 when the leakage current Ileak1 of the normally-on switching unit 120 is larger than the leakage current Ileak2 of the normally-off switching unit 140 (as shown in FIGS. 3A and 3B).

According to an embodiment of the present disclosure, in the step S610, the step of generating the compensating current Icom1 flow to the normally-off switching unit 140 includes generating the compensating current Icom1 flow from the resistor R1 to the normally-off switching unit 140 according to the operating voltage Vdd of the switching circuit 100. In the step S620, the step of sharing the leakage current Ileak1 of the normally-on switching unit 120 includes providing a current path via the resistor R2 to share the leakage current Ileak1 of the normally-on switching unit 120 (as shown in FIG. 4).

According to another embodiment of the present disclosure, in the step S620, the step of sharing the leakage current Ileak1 of the normally-on switching unit 120 includes providing a current path via the zener diode ZD1 to share the leakage current Ileak1 of the normally-on switching unit 120 (as shown in the FIG. 5).

Details of the operations and functions of the current compensating method 600 are all fully disclosed and described in the above paragraphs. Those skilled in the art can immediately understand how to perform the operations and functions of the method based on the switching circuit 100 in the embodiments described above, and thus a further explanation is omitted herein for the sake of brevity.

The above description includes exemplary operations, but the operations are not necessarily performed in the order described. The order of the operations disclosed in the present disclosure may be changed, or the operations may even be executed simultaneously or partially simultaneously as appropriate, in accordance with the spirit and scope of various embodiments of the present disclosure.

In summary, in the present disclosure, by applying the embodiments described above and using the current compensating unit and the current sharing unit to provide additional current path, to correspondingly compensate the mismatch leakage current in the cascode switches to maintain the operating bias voltage of the upper switch and the lower switch, in order to prevent the failure or the reduction of the performance of the cascode switches resulted from the shifting of the bias voltage due to the leakage current mismatch, and therefore a more reliable power switching device for the power electronics is provided to lessen the shortage of the switching circuits in the prior art.

Although the disclosure has been described in considerable detail with reference to certain embodiments thereof, it will be understood that the embodiments are not intended to limit the disclosure. It will be apparent to those skilled in the art that various modifications and variations can be made to the structure of the present disclosure without departing from the scope or spirit of the disclosure. For example, the current sharing unit may also be the combination of the resistor and the zener diode. In view of the foregoing, it is intended that the present disclosure cover modifications and variations of this disclosure provided they fall within the scope of the following claims.

What is claimed is:

1. A switching circuit, comprising:
    a normally-on switching unit comprising a first terminal, a second terminal and a control terminal;
    a normally-off switching unit comprising:
    a first terminal electrically connected to the second terminal of the normally-on switching unit;
    a second terminal electrically connected to the control terminal of the normally-on switching unit; and
    a control terminal;
    a current compensating unit electrically connected between the first terminal of the normally-on switching unit and the second terminal of the normally-on switching unit, and configured to generate a compensating current flow to the normally-off switching unit when the leakage current of the normally-on switching unit is smaller than the leakage current of the normally-off switching unit; and a current sharing unit electrically connected between the first terminal of the normally-off switching unit and the second terminal of the normally-off switching unit, and configured to share the leakage current of the normally-on switching unit when the leakage current of the normally-on switching unit is larger than the leakage current of the normally-off switching unit;

wherein the current compensating unit comprises a first resistor electrically connected between the first terminal of the normally-on switching unit and the second terminal of the normally-on switching unit.

2. The switching circuit of claim 1, wherein the second terminal of the normally-on switching unit is operated by a bias voltage, and an operating region of the bias voltage is between a breakdown voltage of the normally-off switching unit and a threshold voltage value, wherein the threshold voltage value causes the normally-on switching unit to be semi-on.

3. The switching circuit of claim 1, wherein the current sharing unit comprises a second resistor electrically connected between the first terminal of the normally-off switching unit and the second terminal of the normally-off switching unit.

4. The switching circuit of claim 3, wherein the equivalent resistance value of the first resistor is configured between 10 megohm and 100 megohm, and the equivalent resistance value of the second resistor is configured between 0.1 megohm and 20 megohm.

5. The switching circuit of claim 3, wherein the first resistor and the second resistor are variable resistors, and the equivalent resistance value of the first resistor and the second resistor are dynamically adjusted according to an operating voltage of the switching circuit respectively.

6. The switching circuit of claim 1, wherein the current sharing unit comprises a zener diode electrically connected between the first terminal of the normally-off switching unit and the second terminal of the normally-off switching unit.

7. The switching circuit of claim 1, wherein the normally-on switching unit comprises a III-V compound semiconductor element, and the normally-off switching unit comprises a silicon based semiconductor element.

8. A switching circuit, comprising:
a junction field-effect transistor, comprising a first drain terminal, a first source terminal and a first gate terminal;
a first metal-oxide-semiconductor field-effect transistor, comprising:
a second drain terminal electrically connected to the first source terminal;
a second source terminal electrically connected to the first gate terminal; and
a second gate terminal;
a first resistor electrically connected between the first drain terminal and the first source terminal; and
a current sharing element electrically connected between the second drain terminal and the second source terminal.

9. The switching circuit of claim 8, wherein the current sharing element comprises a second resistor electrically connected between the second drain terminal and the second source terminal.

10. The switching circuit of claim 9, wherein the equivalent resistance value of the first resistor is configured between 10 megohm and 100 megohm, and the equivalent resistance value of the second resistor is configured between 0.1 megohm and 20 megohm.

11. The switching circuit of claim 8, wherein the current sharing element comprises a zener diode electrically connected between the second drain terminal and the second source terminal.

12. A current compensating method of a switching circuit, wherein the switching circuit comprises a normally-on switching unit, a normally-off switching unit, a current compensating unit and a current sharing unit, the normally-on switching unit comprises a first terminal, a second terminal and a control terminal, the normally-off switching unit comprises a first terminal, a second terminal and a control terminal, wherein the first terminal of the normally-off switching unit is electrically connected to the second terminal of the normally-on switching unit, the second terminal of the normally-off switching unit is electrically connected to the control terminal of the normally-on switching unit, the current compensating unit is electrically connected to the first terminal of the normally-on switching unit and the second terminal of the normally-on switching unit, the current sharing unit is electrically connected to the first terminal of the normally-off switching unit and the second terminal of the normally-off switching unit, wherein the current compensating unit comprises a first resistor electrically connected between the first terminal of the normally-on switching unit and the second terminal of the normally-on switching unit, and the current compensating method comprises:
generating a compensating current flow to the normally-off switching unit by the current compensating unit when the leakage current of the normally-on switching unit is smaller than the leakage current of the normally-off switching unit;
sharing the leakage current of the normally-on switching unit by the current sharing unit when the leakage current of the normally-on switching unit is larger than the leakage current of the normally-off switching unit;
wherein the step of generating the compensating current flow to the normally-off switching unit comprises:
generating the compensating current flow from the first resistor to the normally-off switching unit according to an operating voltage of the switching circuit.

13. The current compensating method of claim 12, wherein the current sharing unit comprises a second resistor, and the step of sharing the leakage current of the normally-on switching unit comprises:
providing a current path via the second resistor to share the leakage current of the normally-on switching unit.

14. The current compensating method of claim 12, wherein the current sharing unit comprises a zener diode, and the step of sharing the leakage current of the normally-on switching unit comprises:
providing a current path via the zener diode to share the leakage current of the normally-on switching unit.

* * * * *